(12) United States Patent
Wu

(10) Patent No.: US 7,557,664 B1
(45) Date of Patent: Jul. 7, 2009

(54) INJECTION-LOCKED FREQUENCY DIVIDER

(75) Inventor: Hui Wu, Pittsford, NY (US)

(73) Assignee: University of Rochester, Rochester, NY (US)

( * ) Notice: Subject to any disclaimer, the term of this patent is extended or adjusted under 35 U.S.C. 154(b) by 0 days.

(21) Appl. No.: 11/590,000

(22) Filed: Oct. 31, 2006

Related U.S. Application Data

(60) Provisional application No. 60/731,492, filed on Oct. 31, 2005.

(51) Int. Cl.
*H03B 19/12* (2006.01)

(52) U.S. Cl. ............ 331/51; 331/117 R; 331/167; 327/115

(58) Field of Classification Search ............ 331/51, 331/167, 117 R; 327/115
See application file for complete search history.

(56) References Cited

U.S. PATENT DOCUMENTS 4,608,539 A * 8/1986 Lawton ............ 329/318
2003/0199259 A1* 10/2003 Macedo et al. ............ 455/141

OTHER PUBLICATIONS

Marc Tiebout, "A CMOS Direct Injection-Locked Oscillator Topology as High-Frequency Low-Power Frequency Divider", Jul. 7, 2004, IEEE Journal of Solid State Circuits, vol. 39, pp. 1170-1174.*

* cited by examiner

*Primary Examiner*—Joseph Chang
(74) *Attorney, Agent, or Firm*—Blank Rome LLP

(57) ABSTRACT

An injection-locked frequency divider (ILFD) can go beyond simple frequency division by an even number. In one embodiment, another differential pair of transistors is added to convert the injection signal into differential currents, which are mixed in the original transistor pair such as that of the conventional ILFD shown above. In another, a double-balanced ILFD structure includes multiple ILFD's which are independently tunable to allow phase differences other than quadrature.

8 Claims, 21 Drawing Sheets

Fig. 1. A conventional divide-by-2 ILFD.

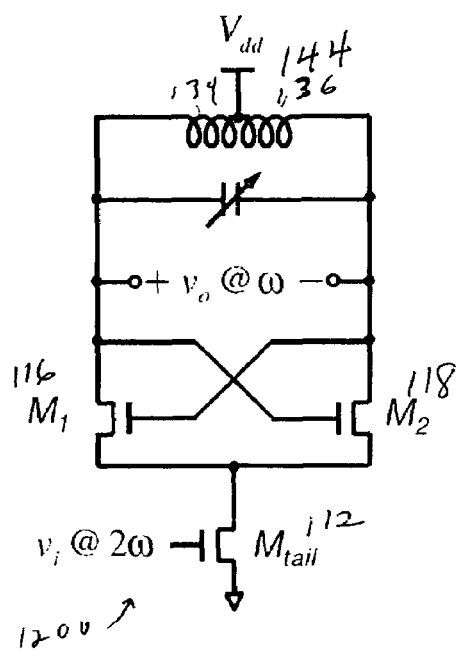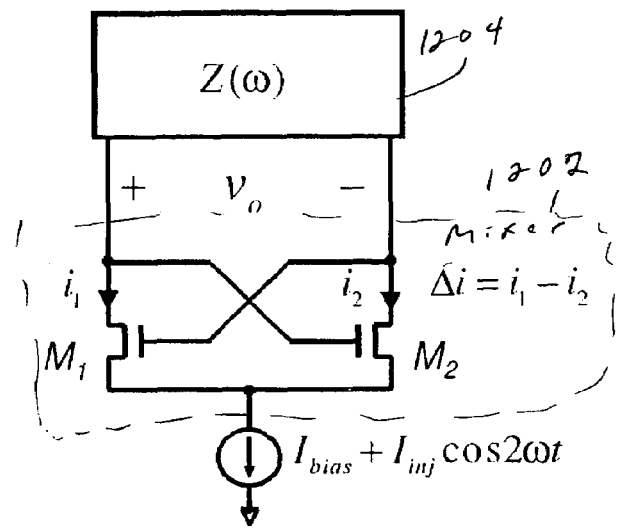
Fig. 12A
Fig. 12B
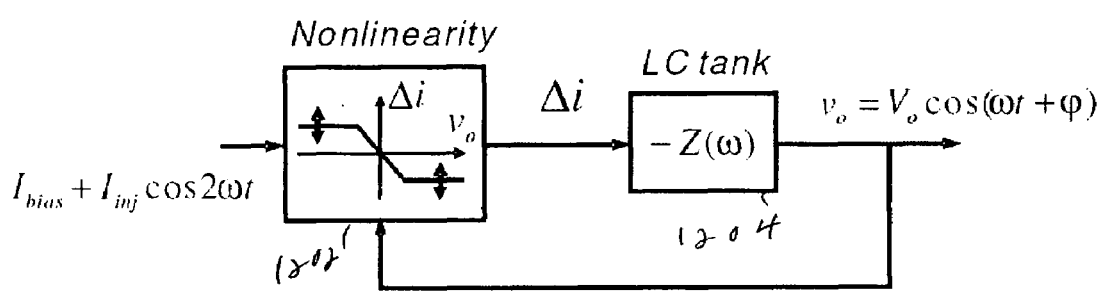
Fig. 12C

INJECTION-LOCKED FREQUENCY DIVIDER

REFERENCE TO RELATED APPLICATION

The present application claims the benefit of U.S. Provisional Patent Application No. 60/731,492, filed Oct. 31, 2005, whose disclosure is hereby incorporated by reference in its entirety into the present disclosure.

FIELD OF THE INVENTION

The present invention is directed to an injection-locked frequency divider and more particularly to an injection-locked frequency divider which expands the capabilities of existing injection-locked frequency dividers beyond simple frequency division by an even number.

DESCRIPTION OF RELATED ART

Frequency dividers are essential building blocks in wireless and wireline communications as well as radar systems for functions such as frequency synthesis, quadrature signal generation, MUX/DEMUX, and bandwidth compression. Currently, static or dynamic "digital" dividers are commonly used in these RF/microwave systems because it is widely believed that they have simpler structure, larger bandwidth, and better robustness over process variations than conventional analog dividers. As the operation frequencies increase, the trade-off between the speed and power dissipation of digital dividers becomes more critical, especially in mobile applications. Due to large power dissipation, high-speed digital dividers can also introduce considerable noise degradation. A harmonic-injection-locked oscillator can be used as a frequency divider, namely, an injection-locked frequency divider (ILFD). An ILFD has inherent advantage in both speed and power dissipation compared to a digital divider. It is fundamentally an oscillator at the subharmonic frequency of the input signal, which effectively lowers the speed requirement for the process technology by n-fold. As a resonant circuit, only a fraction of the stored energy is dissipated in every cycle, which is determined by the quality factor Q of the resonator. This means that an ILFD can have significantly lower power consumption than a digital divider. The disadvantages of ILFDs are the limited locking range and division ratio.

A differential LC oscillator has become a popular choice for ILFDs. Such a differential LC oscillator is shown in FIG. 1 as 100. An input voltage $V_{in}$ at an input 102 is supplied to a capacitor 104 having a value $C_{in}$, while a bias voltage $V_{bias}$ at a bias input 106 is supplied to a resistor 108. The two are combined at a gate 110 of a tail transistor $M_{tail}$ 112, whose drain 114 is connected to node A. Node A is in turn connected to transistors $M_1$ 116 and $M_2$ 118, whose gates 120, 122 are connected to buffers 124, 126 and thence to outputs 128, 130, where output voltages $V_{out1}$ and $V_{out2}$ are output. A resonator or LC tank 132 is formed from inductors 134 and 136 having values $L_1$ and $L_2$, varactors 138 and 140 having values $C_{r1}$ and $C_{r2}$, an input 142 for receiving a tuning voltage $V_{tune}$, and an input 144 for receiving a voltage $V_{dd}$.

When there is no input signal, i.e., the oscillator is free-running, there exists a signal at node A (the drain 114 of the tail transistor, $M_{tail}$), which is at the second harmonic of the free-running oscillation frequency $f_0$. Therefore, this topology is inherently suitable for divide-by-2 operation. On the other hand, it can only support frequency division ratio of even numbers (2, 4, 6 . . . ) due to the differential nature. This would limit its usage in applications where odd-number division ratio (e.g., divide-by-3) is more desirable. Such a differential LC ILFD can be viewed as a special regenerative divider, whose core is shown in FIG. 2 as 200, in which the transistors 116, 118 and 112 ($M_1$, $M_2$, and $M_{tail}$) act as a single-balanced mixer 202, and the LC tank as the filter, with the feedback loop formed by the cross coupling. Frequency division happens when the 2nd-harmonic current is injected into node A by $M_{tail}$, and switched by the differential pair of $M_1$ and $M_2$ to generate the mixing products. Then all other harmonics except the fundamental frequency component are filtered out. Because the nonlinearity of the switching operation of the differential pair $M_1$ and $M_2$ has odd symmetry, it can only generate mixing products of odd-number orders, which corresponds to division ratios of even numbers (2, 4, 6 . . . ).

In modern digital communication systems, it is increasingly important to generate accurate multi-phase signals. For example, in-phase and quadrature LO signals are required for quadrature modulation, quadrature down-conversion, and Weaver image rejection. Passive phase shift circuits such as poly-phase filters are commonly used in low-GHz applications for this purpose. Their disadvantages are limited bandwidth per stage, large signal attenuation, and noise degradation. Ring and coupled oscillators can also be used to generate accurate multi-phase signals, but they suffer from inferior phase noise performance, especially at high frequencies. Toggle-flip-flop digital frequency dividers are widely used to generate quadrature signals. However, their phase accuracy depends on the input signal duty-cycle, and the large power consumption is also a concern at high frequencies. Recently, ILFDs have been demonstrated for quadrature generation with good phase accuracy and substantially lower power consumption. They are particularly suitable for microwave and millimeter-wave applications where the trade-off between speed and power consumption is more challenging. The application of ILFDs in signal generation is so far limited to quadrature cases.

SUMMARY OF THE INVENTION

It is an object of the invention to overcome the above-noted limitations of ILFDs.

It is another object of the invention to provide an ILFD which can divide a frequency by an odd number.

It is another object of the invention to provide an ILFD which can generate signals in cases other than quadrature cases.

To achieve the above and other objects, the present invention is directed to an ILFD which can go beyond simple frequency division by an even number. In one embodiment, another differential pair of transistors is added to convert the injection signal into differential currents, which are mixed in the original transistor pair such as that of the conventional ILFD shown above. In another, a double-balanced ILFD structure includes multiple ILFD's which are independently tunable to allow phase differences other than quadrature.

The following are hereby incorporated by reference in their entireties into the present disclosure:

"A 16 to 18 GHz 0.18 µm Epi-CMOS divide by 3 injection-locked frequency divider," by Hui Wu and Lin Zhang, IEEE International Solid-State Circuit Conference (ISSCC 2006), in San Francisco, on Feb. 4-8, 2006; and "A double-balanced injection-locked frequency divider for tunable dual phase signal generation", by Lin Zhang and Hui Wu, IEEE Radio Frequency Integrated Circuits Symposium (RFIC 2006) in San Francisco on Jun. 11-13, 2006.

BRIEF DESCRIPTION OF THE DRAWINGS

Preferred embodiments of the invention will be disclosed in detail with reference to the drawings, in which:

FIGS. 12A, 12B and 12C are a schematic diagram, an equivalent circuit and a behavior model, respectively, of a divide-by-2 ILFD;

DETAILED DESCRIPTION OF THE PREFERRED EMBODIMENTS

Figure 1:
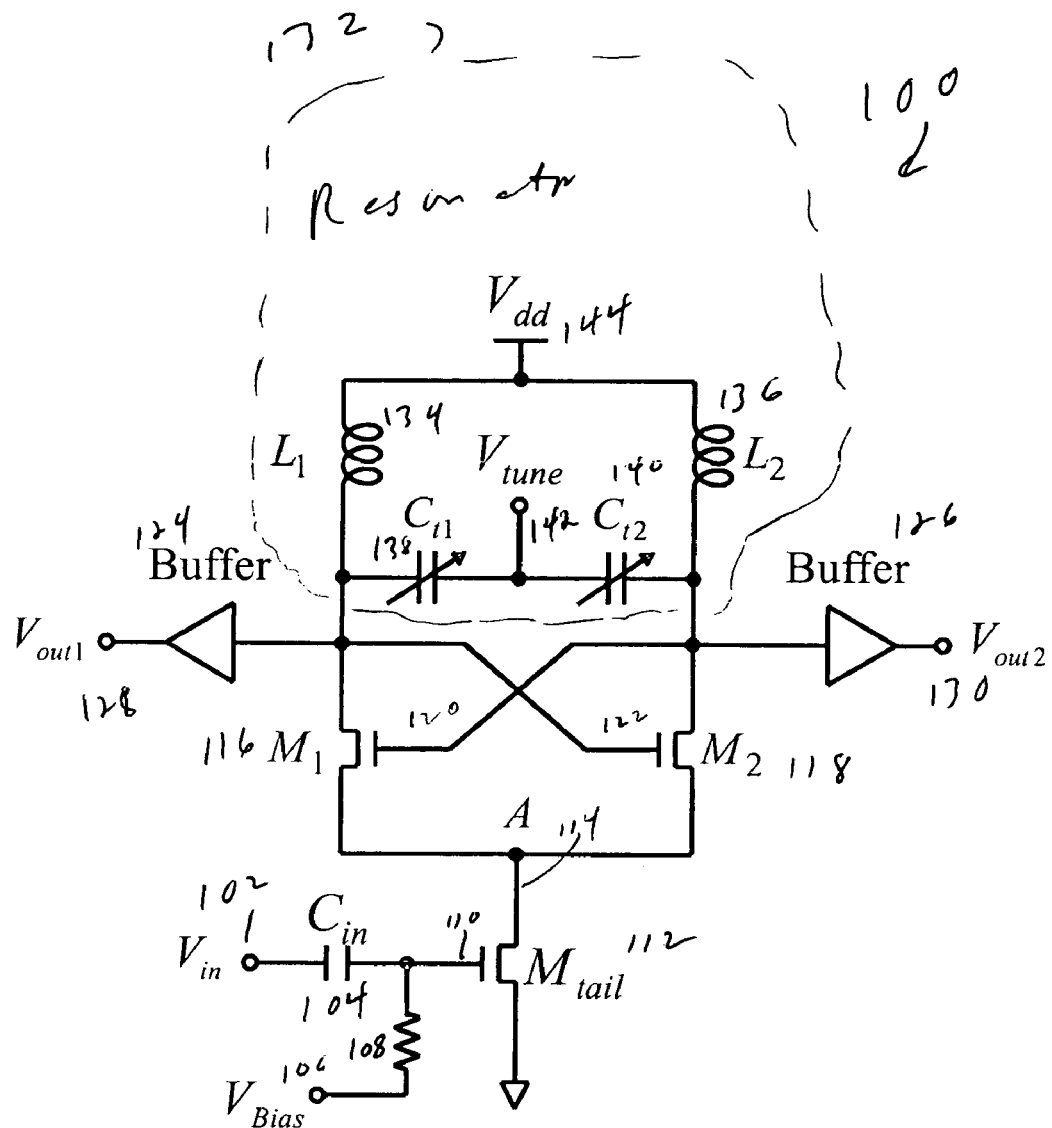
FIG. 1 is a circuit diagram showing a conventional divide-by-2 ILFD.
Figure 2:
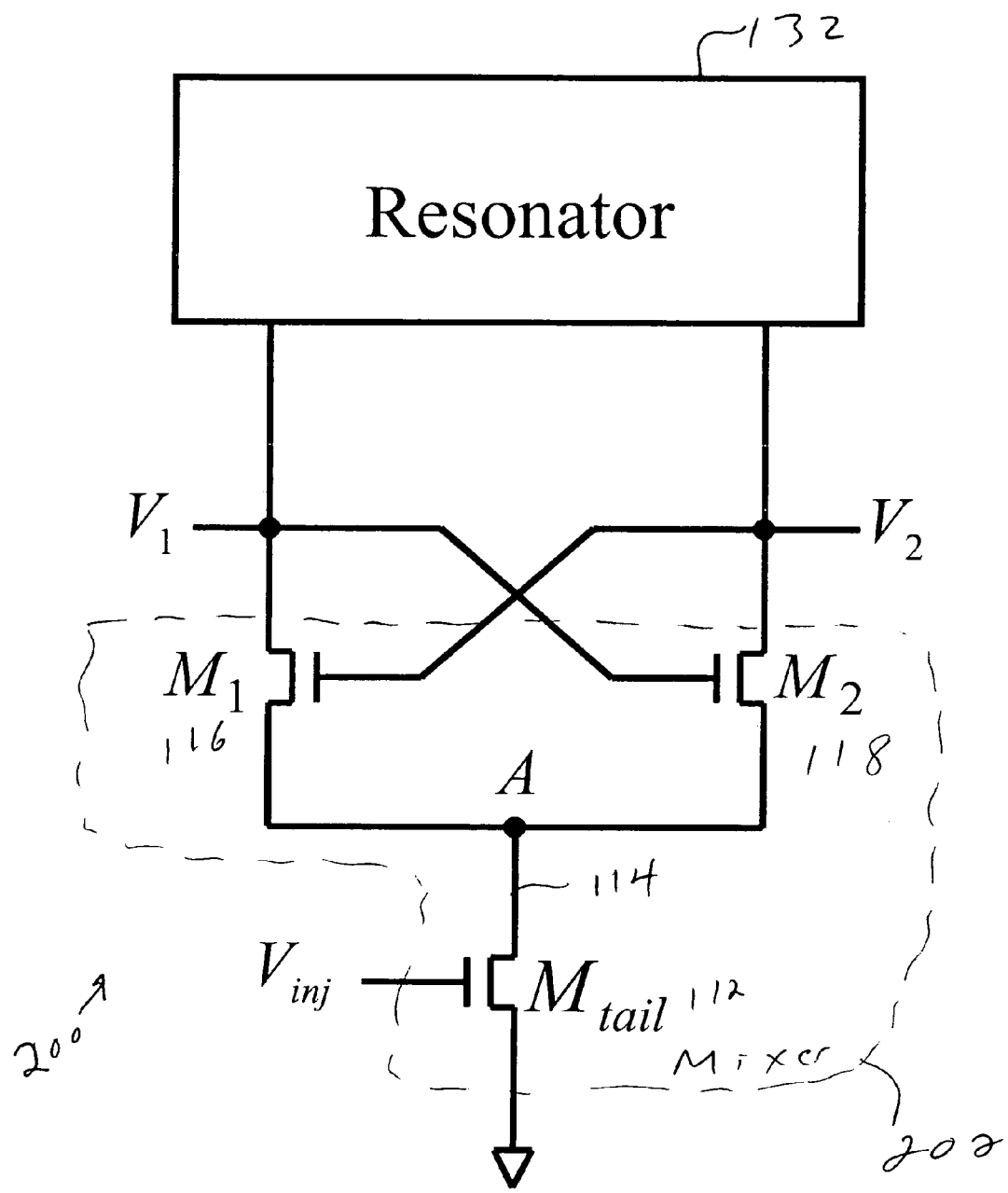
FIG. 2 is a schematic diagram showing a core of a divide-by-2 ILFD.

Preferred embodiments of the invention will be set forth in detail with reference to the drawings, in which like reference numerals refer to like elements throughout.

A first preferred embodiment and variations thereon will now be disclosed.

Figure 3:
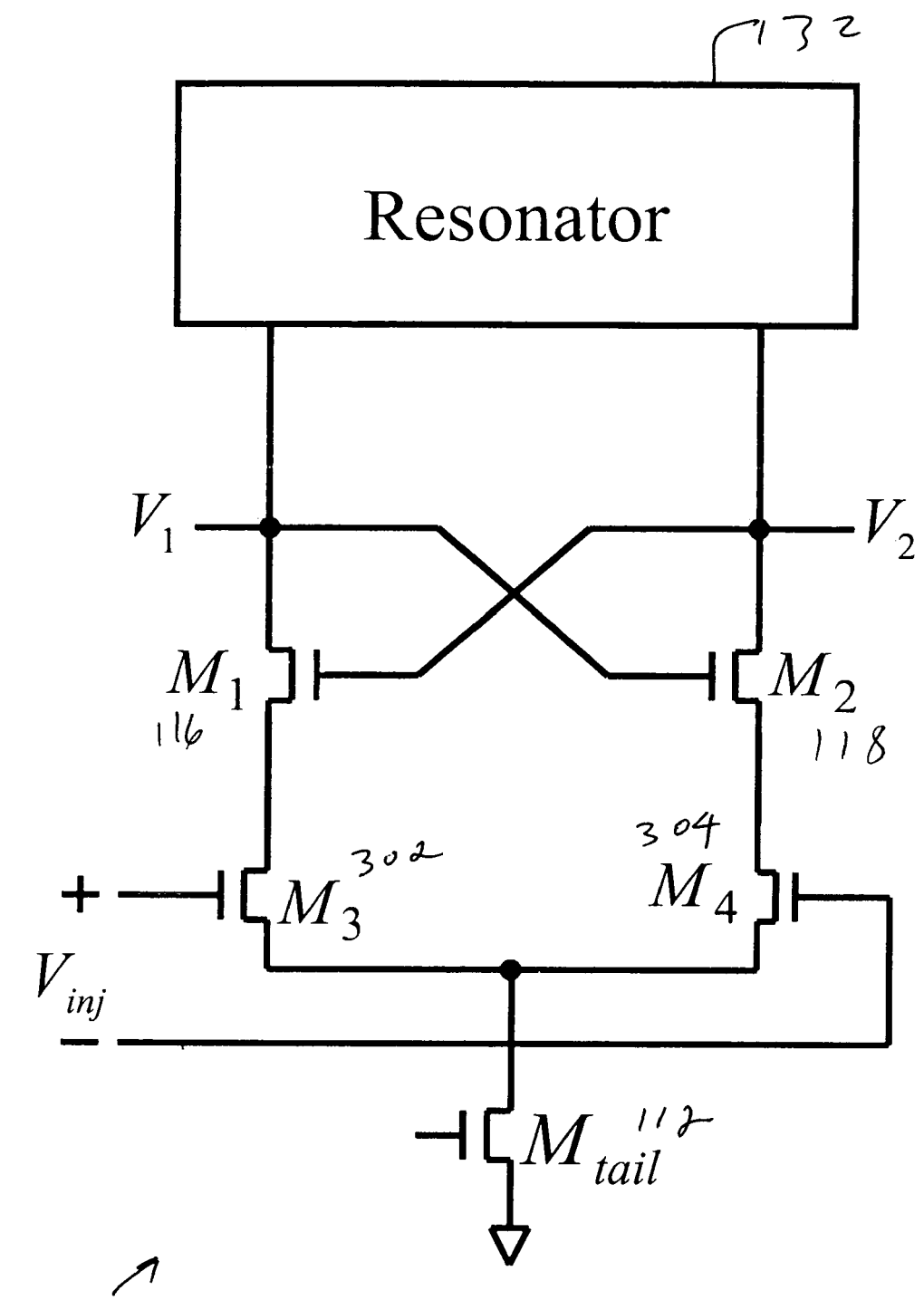
FIG. 3 is a schematic diagram showing a divide-by-odd-number ILFD according to the first preferred embodiment.

To provide frequency division by odd numbers and maintain the differential topology, we construct a differential cascode topology, shown in FIG. 3 as 300, by adding another differential pair of transistors 302 $M_3$ and 304 $M_4$. $M_3$ and $M_4$ convert the differential injection signal $V_{inj}$ into differential currents, which mix with $M_1$ and $M_2$. $M_1$ and $M_2$ are no longer a differential pair because their source terminals are separated. Now the even-order nonlinearity of $M_1$ (similarly $M_2$) can generate the desired mixing product that corresponds to a division ratio of any odd number, e.g., 3.

Figure 4:
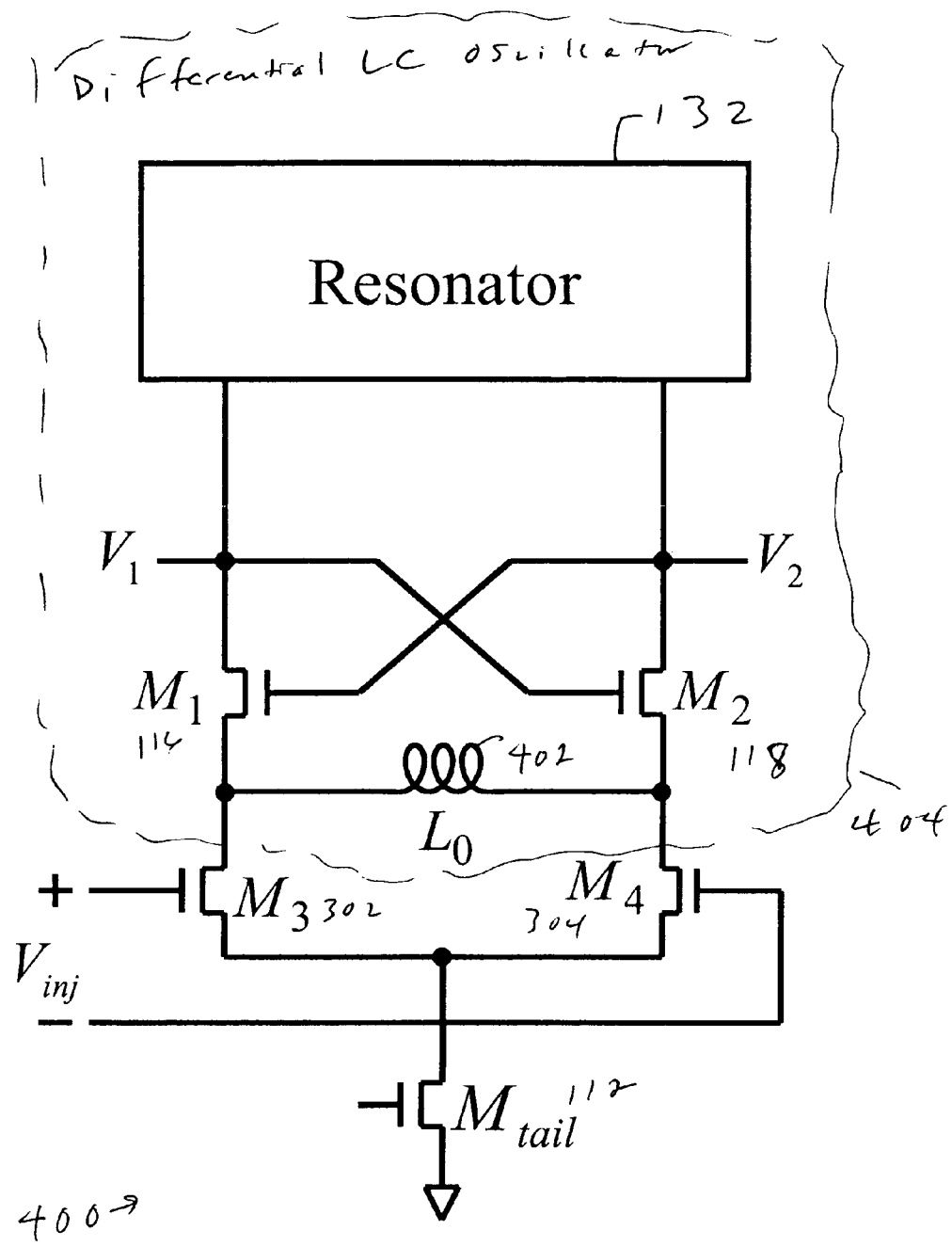
FIG. 4 is a schematic diagram showing an enhanced divide-by-odd-number ILFD according to a variation of the first preferred embodiment.

In an enhanced version of the topology, shown in FIG. 4 as 400, a shunt-peaking inductor 402 having value $L_0$ can be inserted between the source terminals of $M_1$ and $M_2$. $L_0$ resonates with the parasitic capacitances at the injection signal frequency $((2n+1)f_0)$, and thus increases the signal amplitude injected into $M_3$ and $M_4$. It also provides a short-circuit current path at the fundamental frequency $(f_0)$. Therefore, the upper half circuit ($M_1$, $M_2$, $L_0$ and resonator) works as a differential LC oscillator 404 at the fundamental frequency. Overall, we confine signals at different harmonics locally by circuit topology and filtering.

Figure 5:
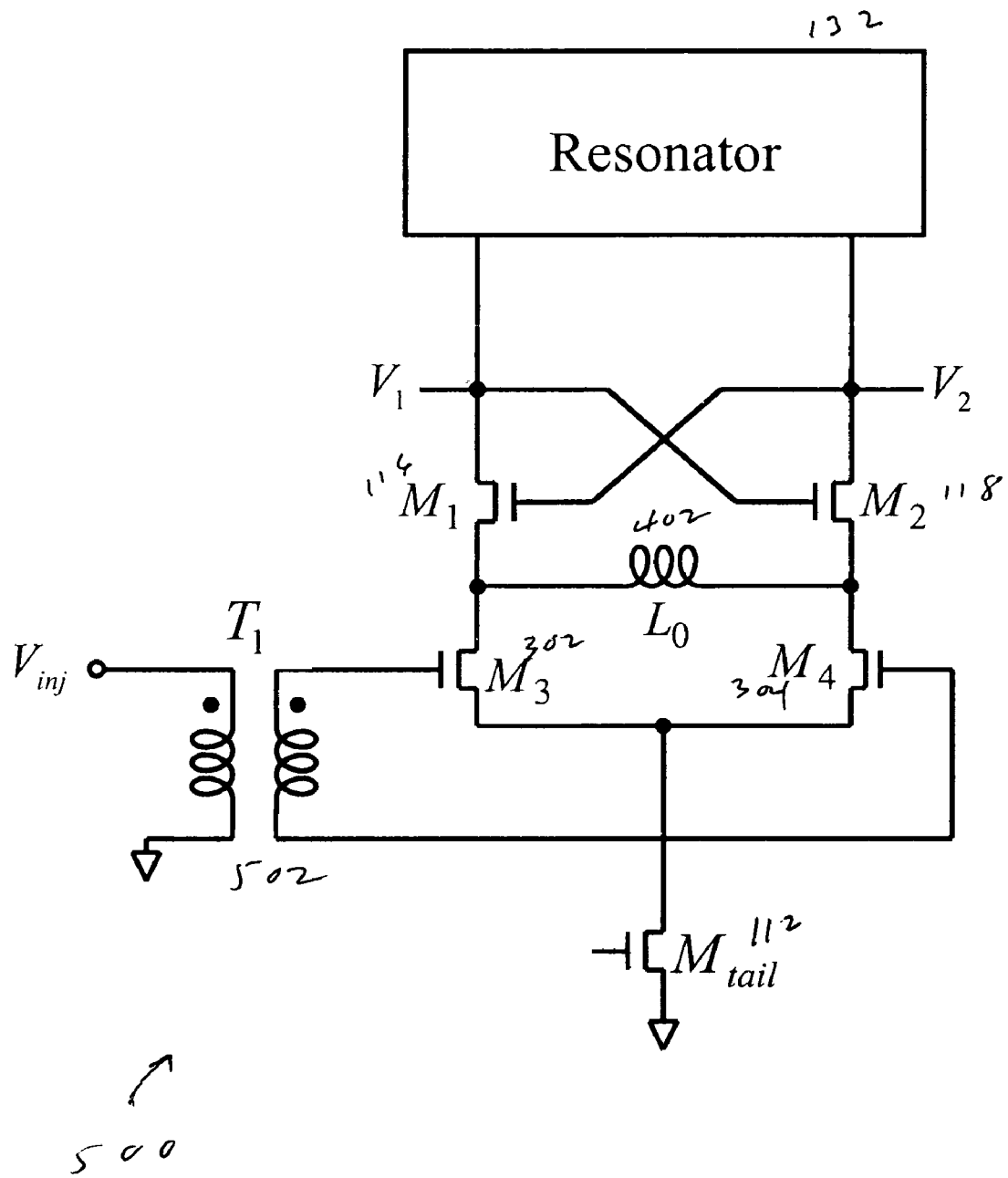
FIG. 5 is a schematic diagram showing an enhanced divide-by-odd-number ILFD with single-ended input according to another variation of the first preferred embodiment.

The differential input can be directly connected when the ILFD is integrated with an on-chip differential source like a differential VCO. In the topology 500 of FIG. 5, when a single-ended source is used, a balun 502 $T_1$ is used to convert the single-ended input signal to differential signals. $T_1$ also helps to match the input impedance of $M_3$ and $M_4$ to the source impedance.

Figure 6:
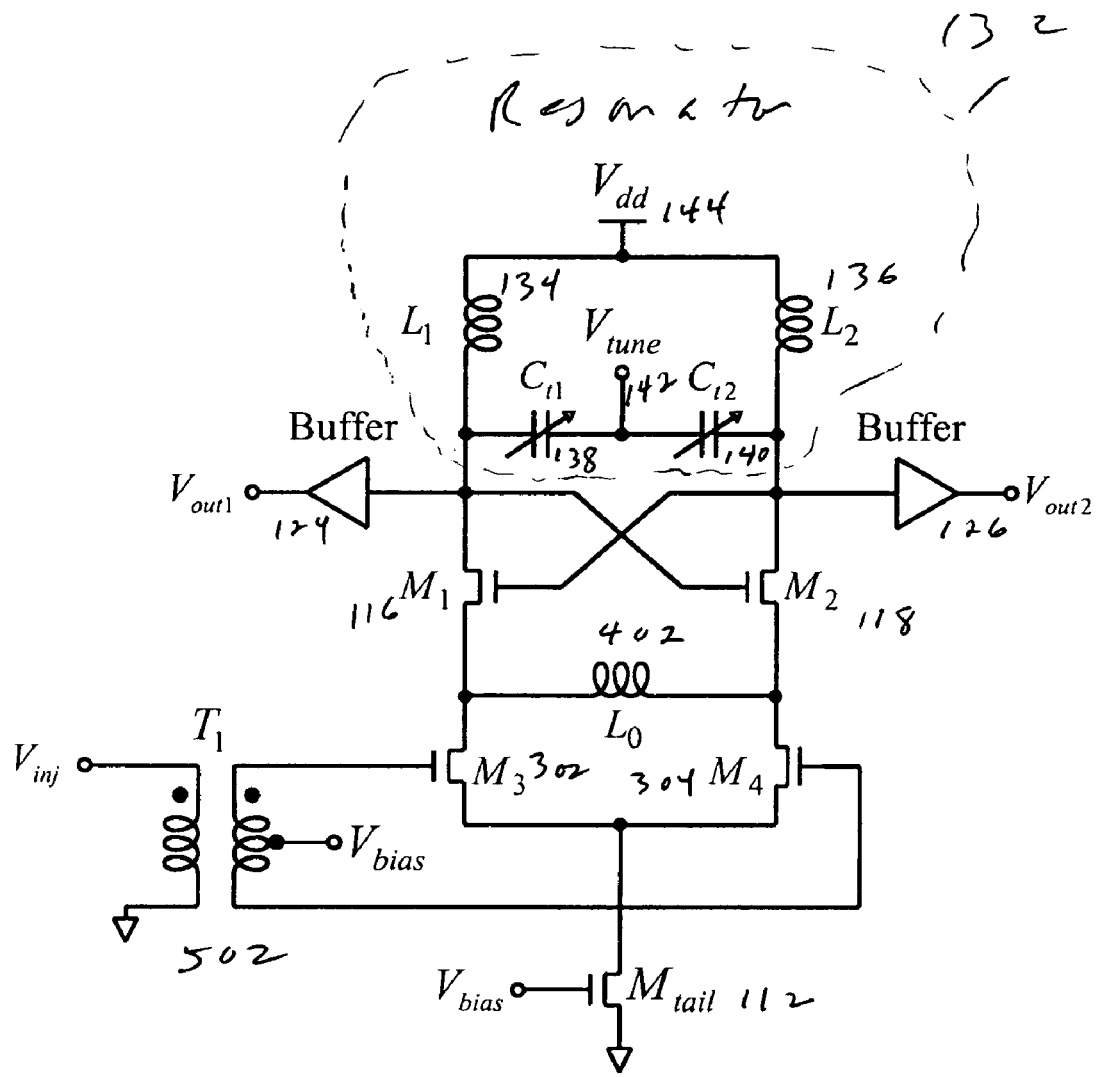
FIG. 6 is a circuit diagram of a prototype divide-by-3 ILFD.
Figure 7:
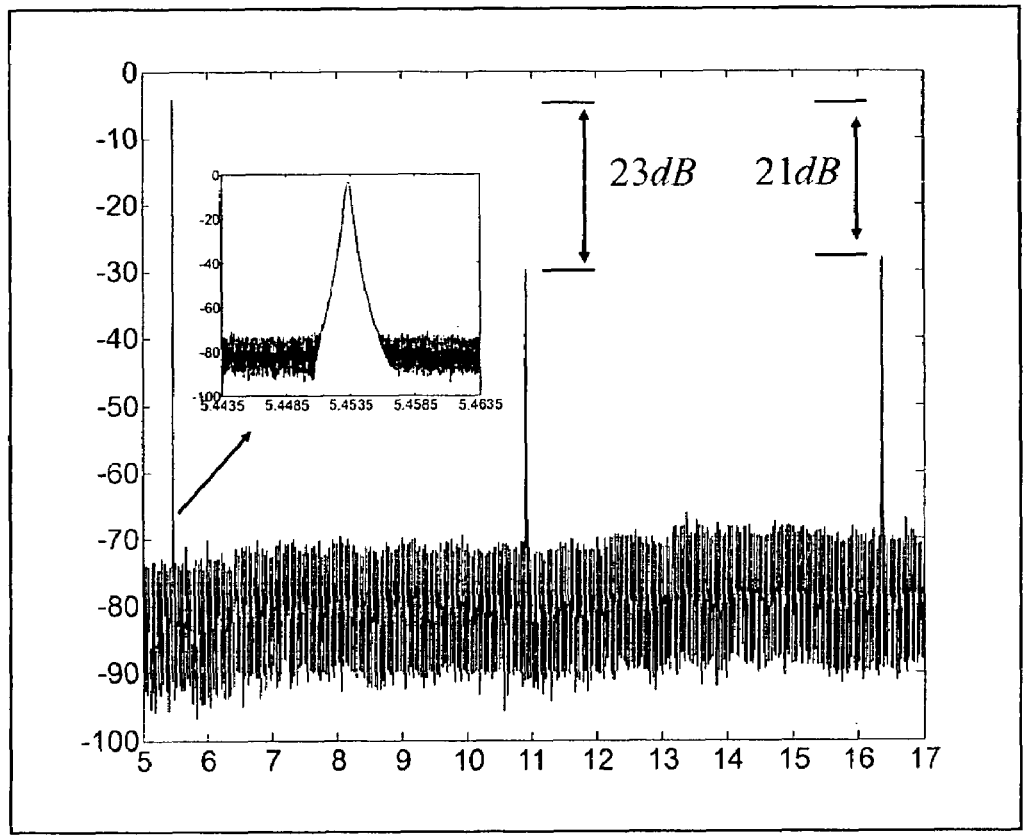
FIG. 7 is a plot of an output spectrum.
Figure 8:
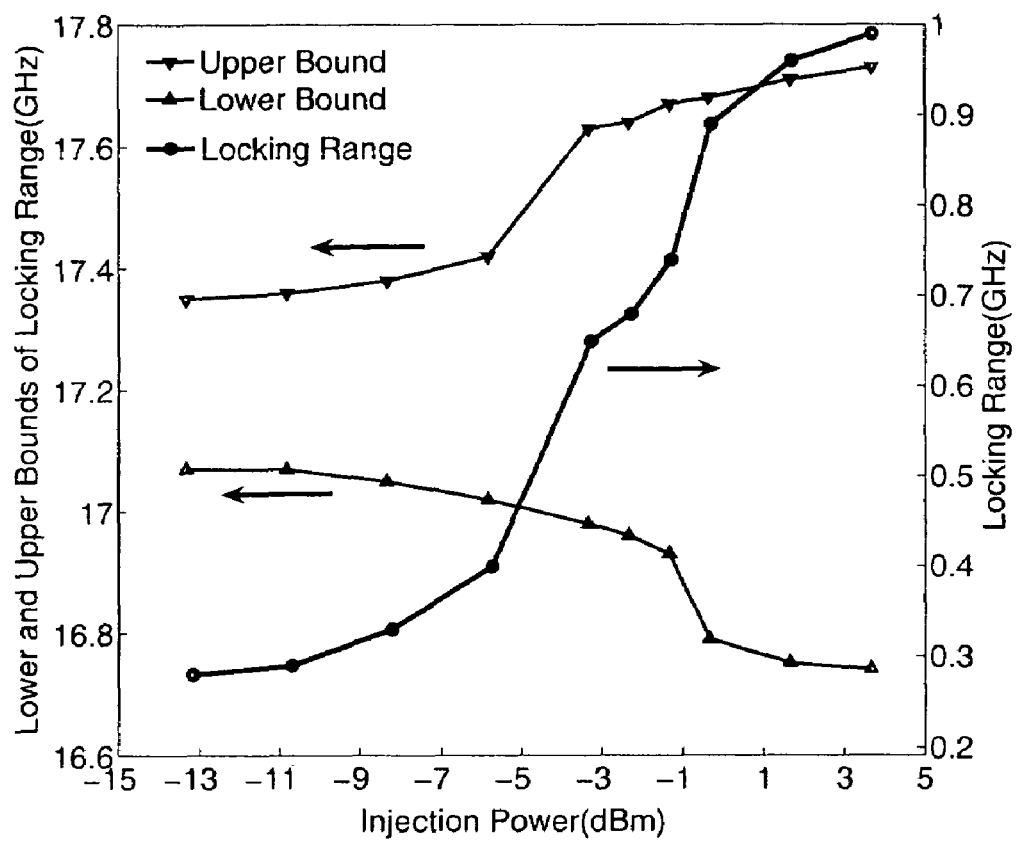
FIG. 8 is a plot of locking range vs. injection power.
Figure 9:
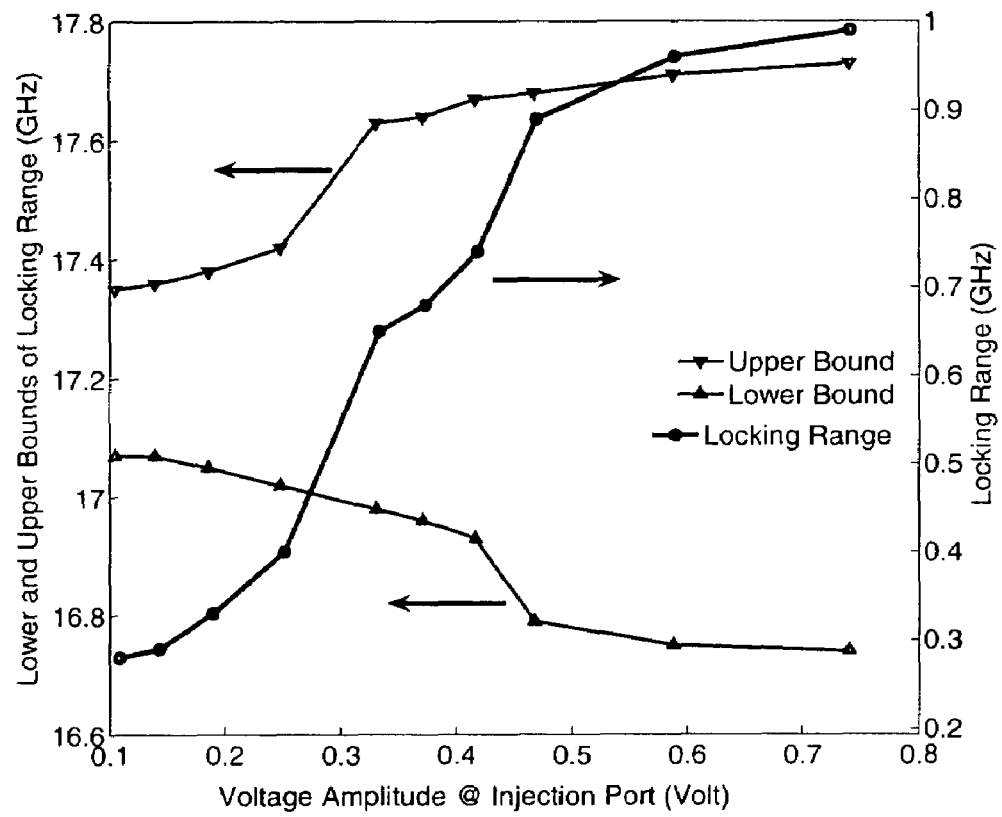
FIG. 9 is a plot of locking range vs. injection voltage.
Figure 10:
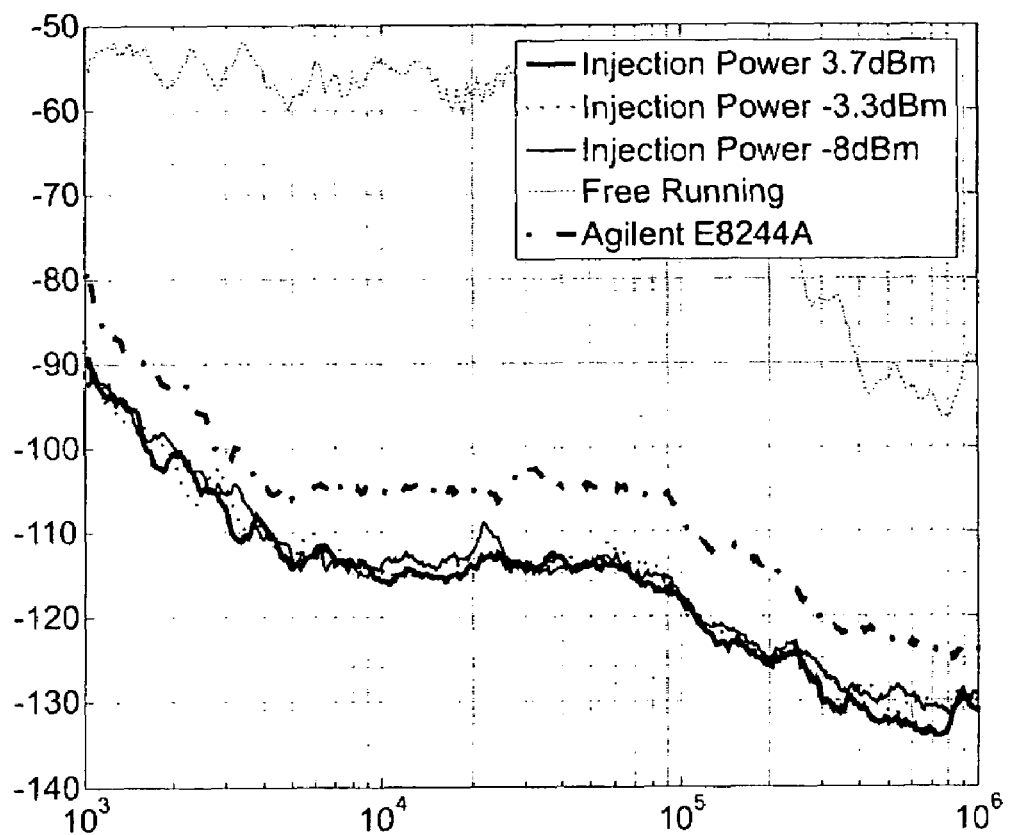
FIG. 10 is a plot of phase noise performance vs. injection power.

A prototype divide-by-3 ILFD, shown in FIG. 6 as 600, was designed using the new topology with input frequency from 16 GHz to 18 GHz. It uses an on-chip LC tank as the resonator 132. Note that other types of resonators can also be used in the implementations of the disclosed inventions. The prototype has been fabricated using a commercial 0.18 µm CMOS technology with low-resistivity epi silicon substrate. The output signal spectrum in locked condition is shown in FIG. 7. The 2nd and 3rd harmonics are −23 dB and −21 dB below the fundamental frequency, and a large part of them is contributed by the open-drain buffer at the output (single-ended measurement). The locking range increases from 0.3 GHz at injection power of −14 dBm to 1 GHz at 4 dBm with little change in the center frequency (FIG. 8). The corresponding input port voltage is calculated using S11 and shown in FIG. 9. Note that this is the single-ended voltage (amplitude) at the primary of the balun with 1:1 transformation ratio. The ILFD can also be tuned by the varactors $C_{t1}$ and $C_{t2}$ with the free-running frequency from 5.37 GHz to 6.1 GHz. FIG. 10 shows the phase noise performance of the ILFD at different injection power levels. The phase noise of the free-running ILFD (no injection) and the signal source is also shown for comparison. Due to the low Q of inductors, the free-running phase noise is not good at all. When the ILFD is in locked condition, the phase noise follows that of the signal source with a 9-10 dB reduction at large injection power (−3 dBm and 3.7 dBm) which matches well with the theoretical value 9.5 dB. For small injection power (−8 dBm), the phase noise degrades only at large offset frequency.

Figure 11:
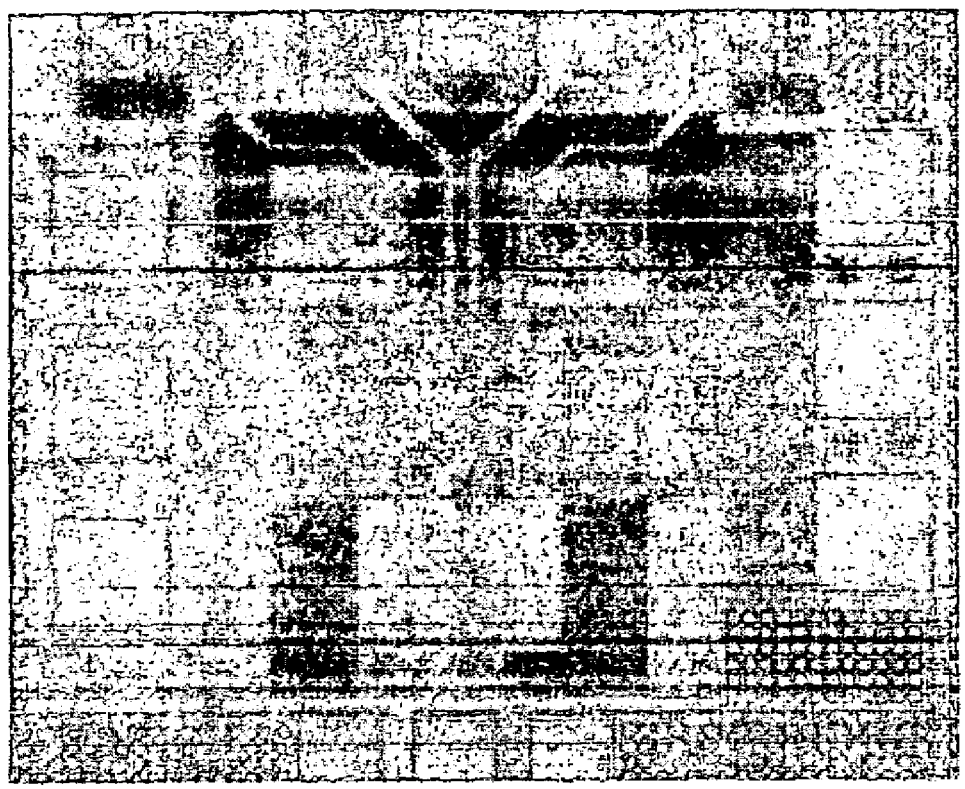
FIG. 11 is a chip micrograph of the prototype.

FIG. 11 is a chip micrograph showing the prototype.

A second preferred embodiment will now be disclosed. The second preferred embodiment permits the generation of signals with arbitrary and tunable phase difference by utilizing the phase shift characteristics of ILFDs (more generally, injection-locked oscillators). This is very attractive in applications that require tunable phases with fine phase resolution, e.g., phase array systems. It can also be used to improve the phase accuracy of quadrature generation.

Figure 13:
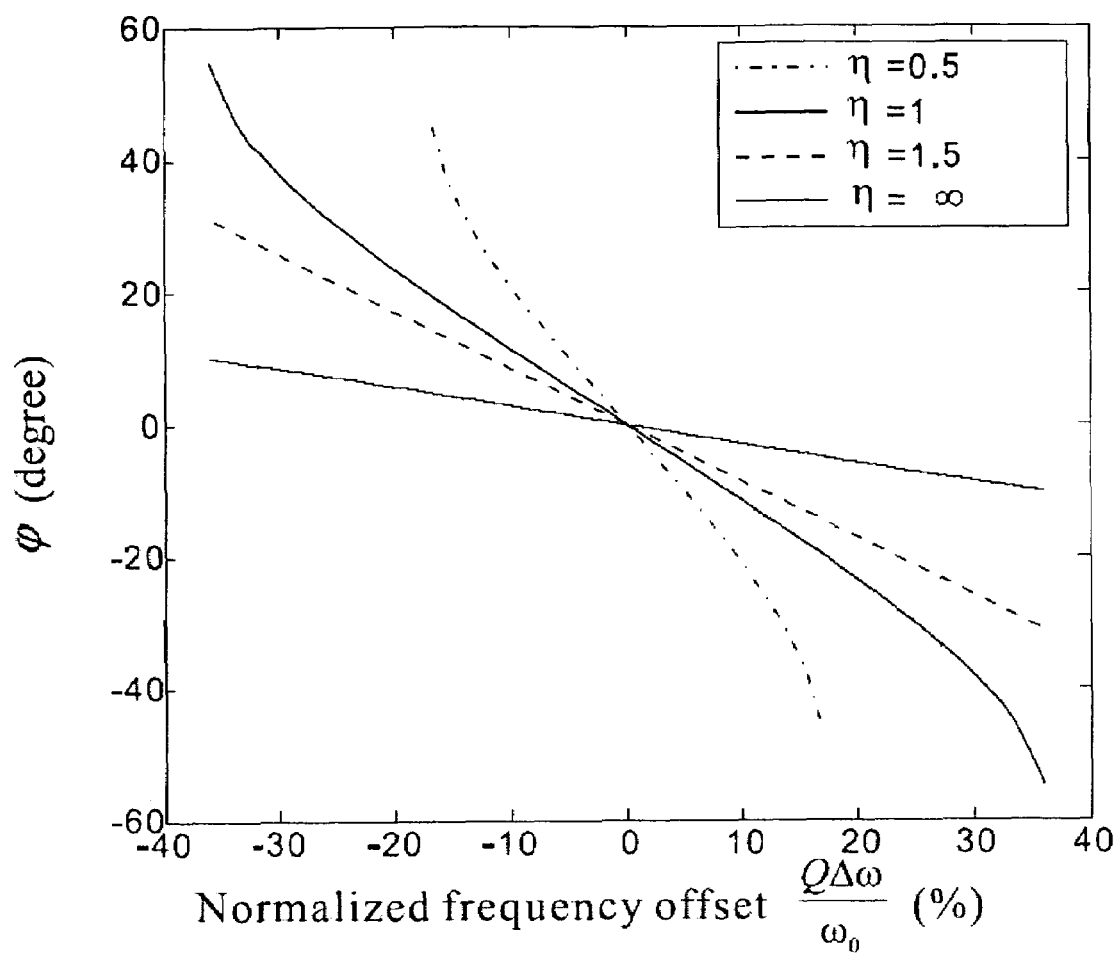
FIG. 13 is a plot of the phase shift characteristics of a differential LC ILFD.

An ILFD can be treated as a simplified regenerative divider with a built-in mixer and filter. For example, a divide-by-2 ILFD based on differential LC oscillator, shown in FIG. 12A as 1200, can be modeled as a regenerative divider with a single-balanced mixer 1202 and an LC tank filter 1204, as shown in FIGS. 12B and 12C. At large oscillation amplitude, assuming ideal switching for the differential pair ($M_1$ and $M_2$), the output signal phase shift $\phi$ can be found as:

$$\varphi = \frac{1}{2}\left[\sin^{-1}\left\{\frac{3/\eta}{\sqrt{1+\left(\frac{\omega_0}{Q\Delta\omega}\right)^2}}\right\} + \sin^{-1}\left\{\frac{1}{\sqrt{1+\left(\frac{\omega_0}{Q\Delta\omega}\right)^2}}\right\}\right]$$

where $\eta \equiv I_{inj}/I_{bias}$ is the injection ratio, $\omega_0$ is the free-running oscillation frequency, $\Delta\omega \equiv \omega - \omega_0$ is the frequency shift, and Q is the LC tank quantity factor. As shown in FIG. 13, the phase shift $\phi$ is a monotonic function of the frequency shift $\Delta\omega$, and the function is quite linear within the locking range except close to the edges.

Figure 14:
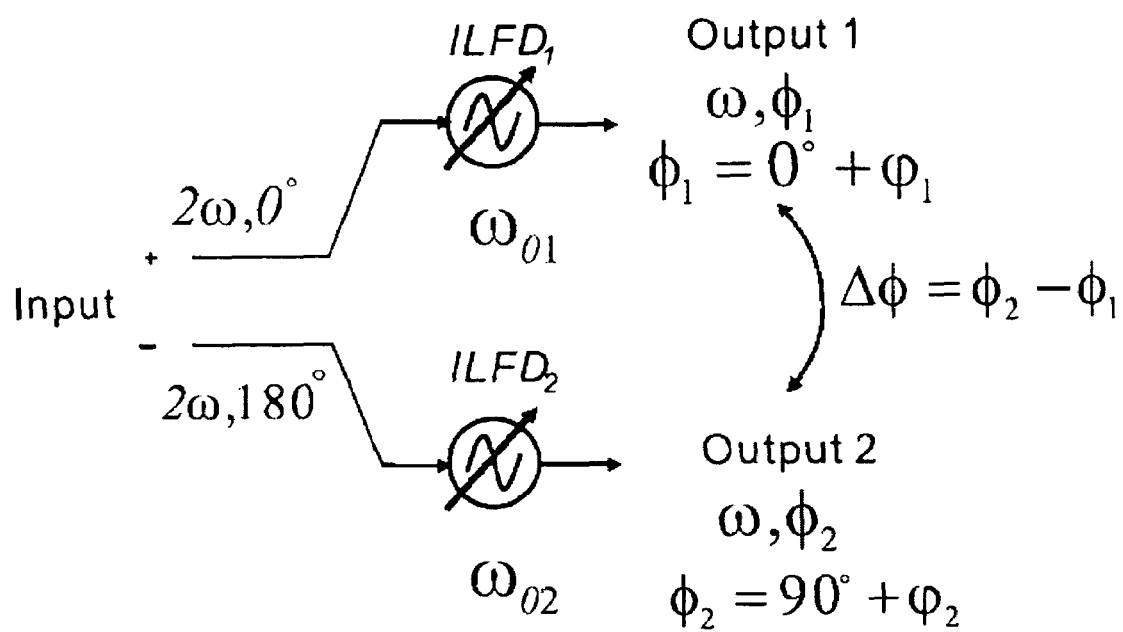
FIG. 14 is a diagram of dual phase generation.
Figure 15A:
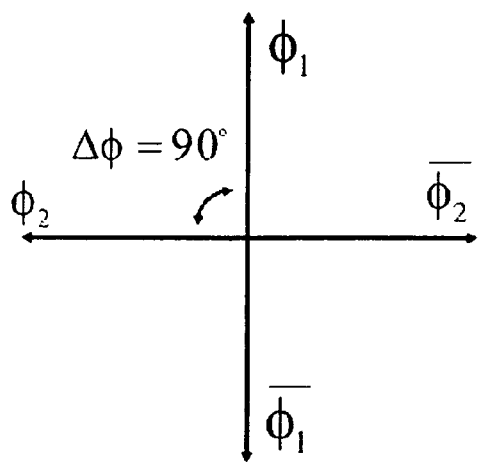
FIG. 15A is a plot of the phase tuning of two ILFDs in quadrature.

When the injected signal changes phase by 180°, the phase of the ILFD output changes by 90°. Therefore, when a differential signal is injected into two identical ILFDs (FIG. 14) with the same free-running oscillation frequency ($\omega_{01}=\omega_{02}$), the two differential output signals are exactly in quadrature, i.e., $\Delta\phi=90°$ (FIG. 15A). The quadrature accuracy is determined by the mismatch between the two ILFDs, and also affected by the injection ratio $\eta$ and Q of the LC tank.

Figure 15B:
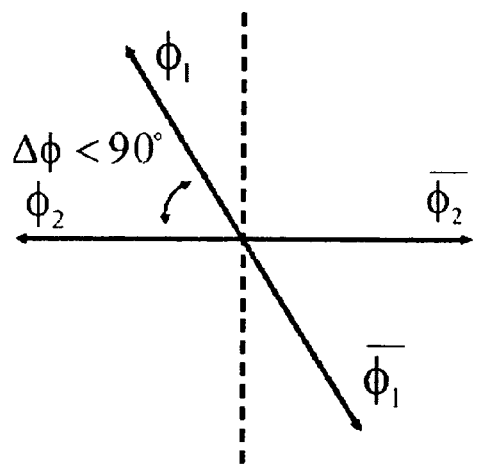
FIGS. 15B and 15C are plots of the phase tuning of two ILFDs in single-ended tuning.
Figure 15C:
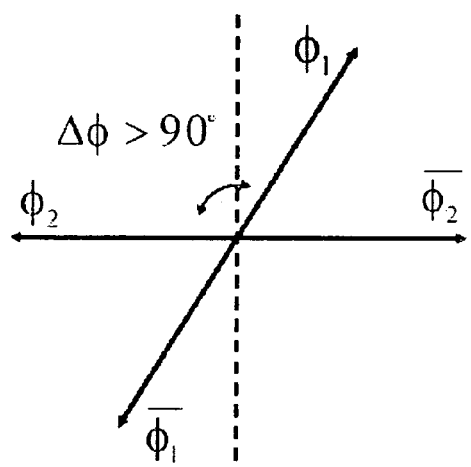
Figure 15D:
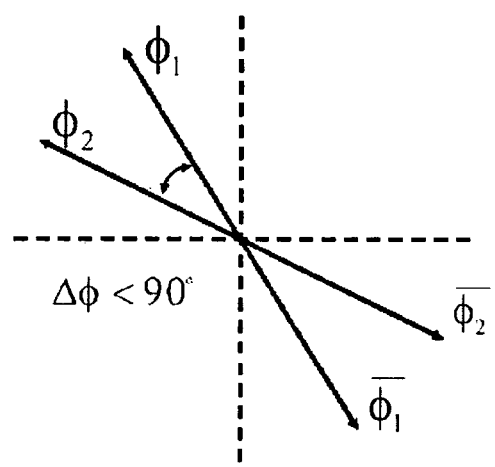
FIG. 15D is a plot of the phase tuning of two ILFDs in differential tuning.

When the two ILFD cores have different free-running oscillation frequencies ($\omega_{01}=\omega_{02}$), $\phi_1$ and $\phi_2$ will no longer be in quadrature but will instead have another phase difference. Therefore, if we frequency-tune $ILFD_1$ or $ILFD_2$, their phase difference $\Delta\phi$ will change accordingly. FIGS. 15B-D shows some possible ways of phase tuning: we can fix $\omega_{02}$ (and hence $\phi_2$), while tuning $\omega_{01}$ to change $\phi_1$; we can also tune $\omega_{01}$ and $\omega_{02}$ (and hence $\phi_1$ and $\phi_2$) differentially to achieve a larger phase tuning range. If the ILFD cores are designed to center their frequency tuning range around half input frequency $\omega$, the phase tuning range will be around quadrature and reaches its maximum when tuning differentially. If the desirable phase tuning range is around $\Delta\phi=0$, we can just injection-locked both ILFD cores with the same single-ended signal.

Notice that the signal amplitude is related to $\phi$ as:

$$V_0 = \frac{4}{\pi}RI_{bias}\left(1+\frac{\eta}{3}\cos2\varphi\right)$$

where R is the equivalent tank resistance. Therefore, in order to maintain an equal signal amplitude for the two outputs, it is also better to tune $\omega_{01}$ and $\omega_{02}$ differentially around $\omega$, in which case $\omega_1 \approx \phi_2$, and hence $\cos 2\phi_1 = \cos 2\phi_2$.

Figure 16:
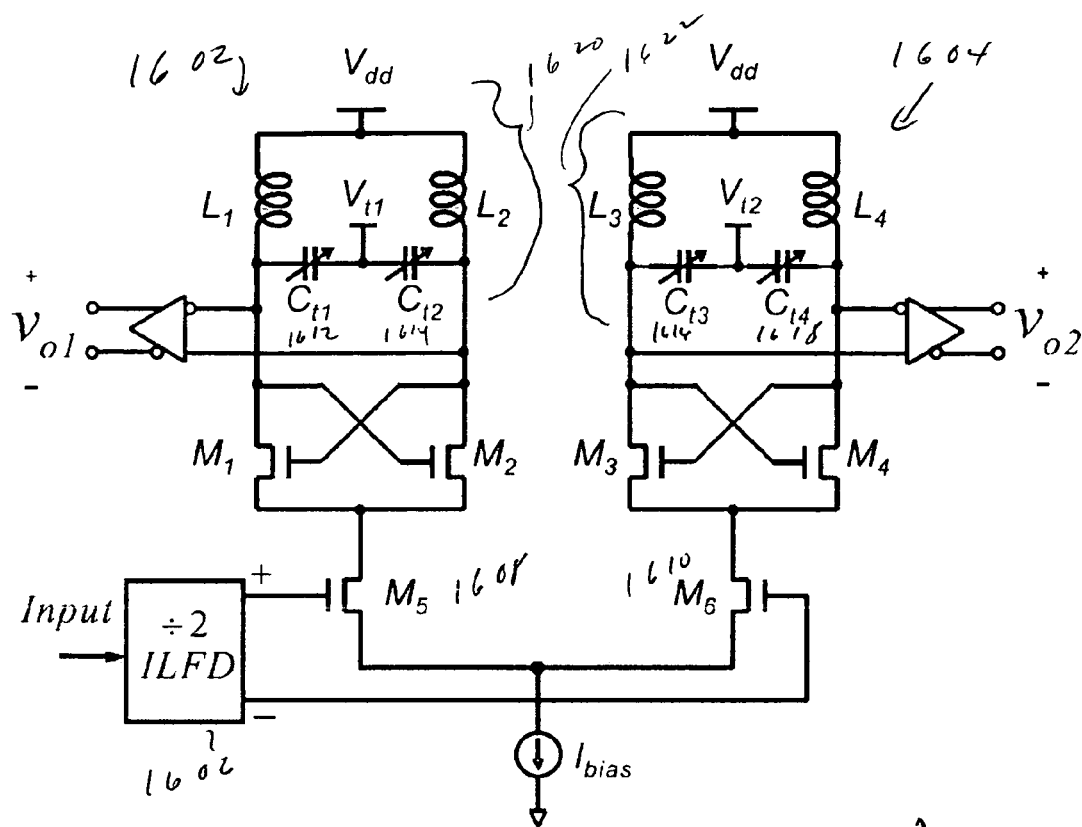
FIG. 16 is a schematic diagram showing a double-balanced ILFD according to the second preferred embodiment.

From the above, it can be seen that both phase shift and output amplitude strongly depend on the injection ratio $\eta$, which in turn depends on both the injection current $I_{inj}$ and bias current $I_{bias}$. In a simple differential LC ILFD, $I_{inj}$ is generated by a transconductor, usually made of the tail transistor. Any variation in transistor size or bias voltage would translate into change in $I_{inj}$, and hence affects the phase accuracy and amplitude equality. To address this problem, we introduce a double-balanced structure similar to a Gilbert cell. As shown in FIG. 16, such a structure 1600 includes two ILFDs: $ILFD_1$ 1602 and $ILFD_2$ 1604. A third ILFD 1606 divides the frequency of the input in half. In such a double-balanced ILFD, the input transconductor is replaced by a differential pair ($M_5$ 1608 and $M_6$ 1610) operating in strong switching mode. Therefore, the injection ratio $\eta$ is determined only by the Fourier series coefficients of an ideal sign function, and hence is largely immune from variations in transistor size or dc bias, given the input voltage signal is sufficiently large. Note that the injection current now consists of multiple harmonics of $2\omega$.

In the prototype, NMOS inversion-mode varactors 1612, 1614, 1616, 1618 ($C_{t1}$ to $C_{t4}$) are used in the LC tanks 1620, 1622 to tune the free-running oscillation frequency. As noted above, another ILFD 1606 is added to serve as an on-chip active balun in order to convert the single-ended signal from a signal source to the differential injection signal with good phase noise. It is a regular differential LC divide-by-2 ILFD like the one in FIG. 12A. Varactor tuning is also included in the balun ILFD to cover the locking range of the main ILFD. Since there is no stringent input bias requirement on the double-balanced ILFD, they are directly dc coupled.

Figure 17:
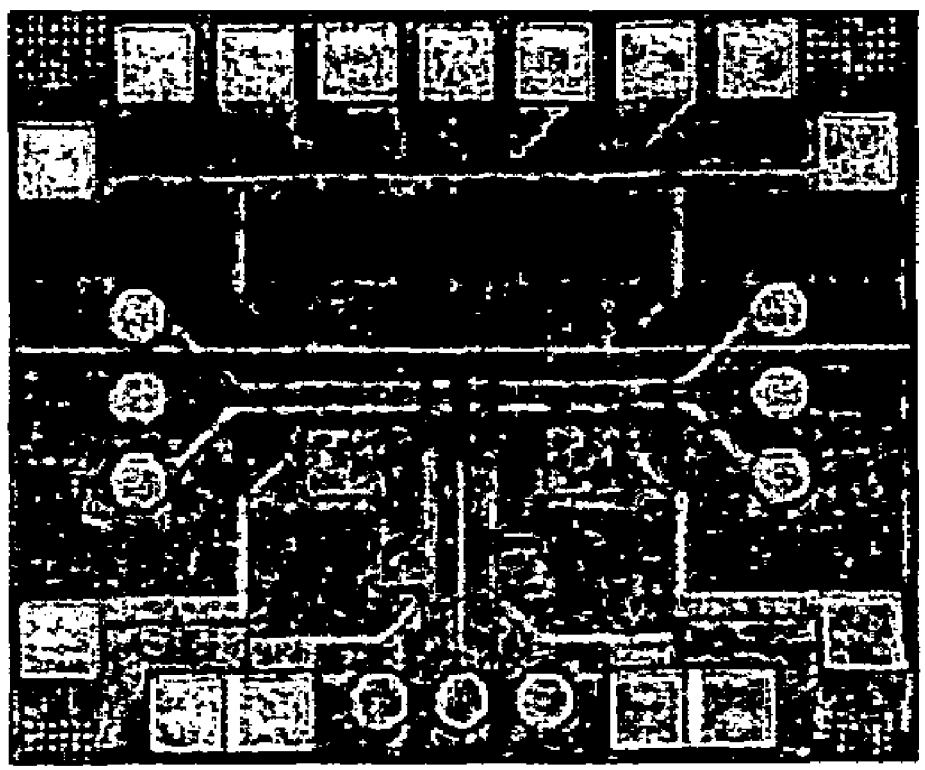
FIG. 17 is a chip micrograph of a prototype of the ILFD of FIG. 16.

The circuit is fabricated using a standard 0.18 µm digital CMOS technology with low-resistivity substrate. Spiral inductors are constructed using the 0.9 µm-thick top metal layer. Due to the thin metal and lossy substrate, the Q of the inductors is about 6 at 5 GHz. Two open drain differential buffers are used at the output ports. The main ILFD consumes 8 mA from a 1.8V power supply. The balun ILFD and the open drain buffers consume 4 mA and 18 mA from 1.4V and 1.8V Vdd, respectively. The die photo is shown in FIG. 17, and the chip size is 1.0 mm×1.1 mm.

Figure 18:
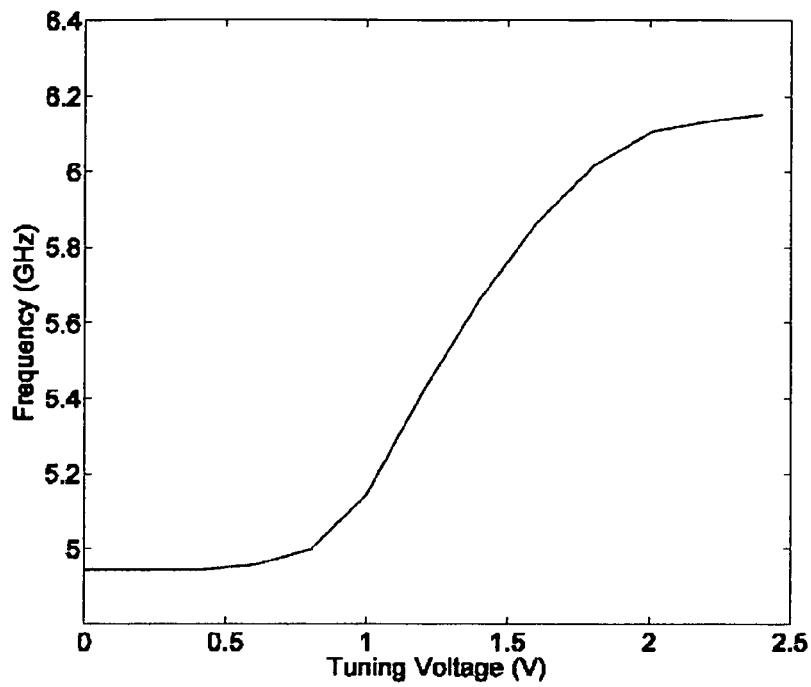
FIG. 18 is a plot of the tuning range of the free-running ILFD core.
Figure 19:
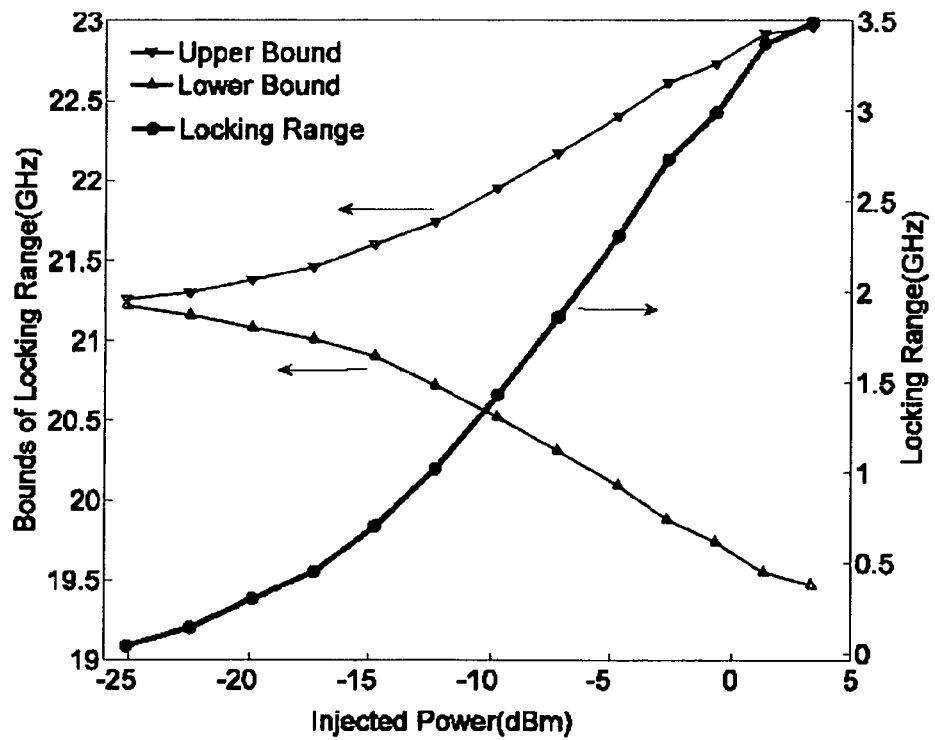
FIG. 19 is a plot of the locking range and the bounds in the middle of the tuning range.

The circuit prototype is measured using a probe station. First, we measured the stand-alone main ILFD cores (without the balun ILFD) implemented in a companion test chip. Their tuning range when free-running is from 4.96 GHz to 6.16 GHz (FIG. 18), and their locking range without tuning is found to be 17%. Then the locking range of the prototype (with the balun ILFD) was measured at different tuning points, and is found to be over 15% across the tuning range (FIG. 19). Notice that the locking range extends symmetrically around the free-running frequency as the injected power increases. Taking into account both the tuning and locking range, the total operation frequency range then extends to 22%, from 4.78 GHz to 5.95 GHz at the outputs.

Figure 20A:
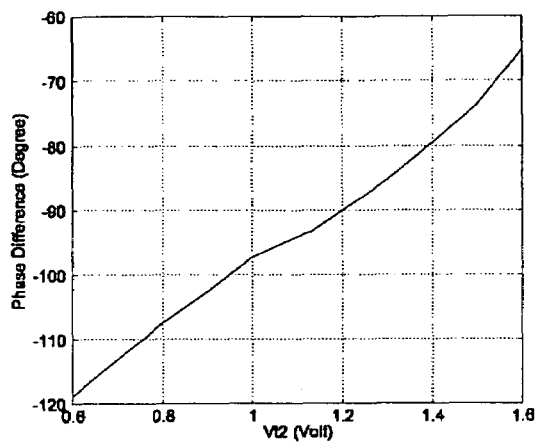
FIGS. 20A-20C are plots of phase tuning.
Figure 20B:
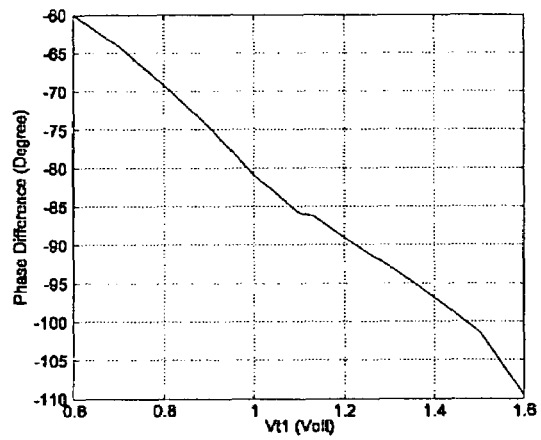
Figure 20C:
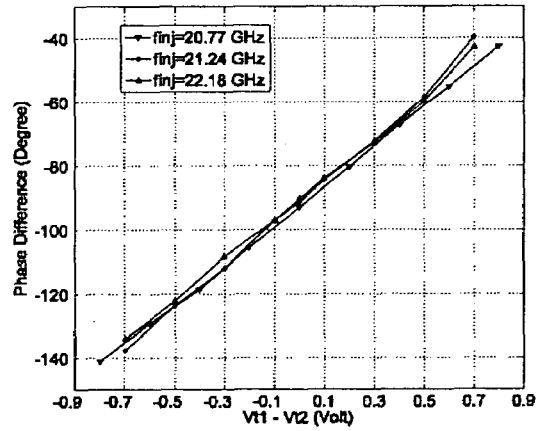

The phase difference of the two output signals are measured using a sampling oscilloscope. Cables and probes are calibrated to remove the phase mismatch introduced by the measurement setup. FIG. 20A shows the case of tuning the first core $ILFD_1$ while keeping $ILFD_2$ at the middle of its tuning range. The phase difference can be varied by 55° around quadrature before the ILFD loses lock. FIG. 20B shows the opposite case of tuning $ILFD_2$ only. A similar 50° phase tuning around quadrature is achieved. When $ILFD_1$ and $ILFD_2$ are tuned differentially, about 100° (40° to 140°) phase tuning is achieved for different input frequencies (FIG. 20C). Compared to single-ended phase tuning, differential tuning shows much better linearity in the tuning characteristics.

Figure 21:
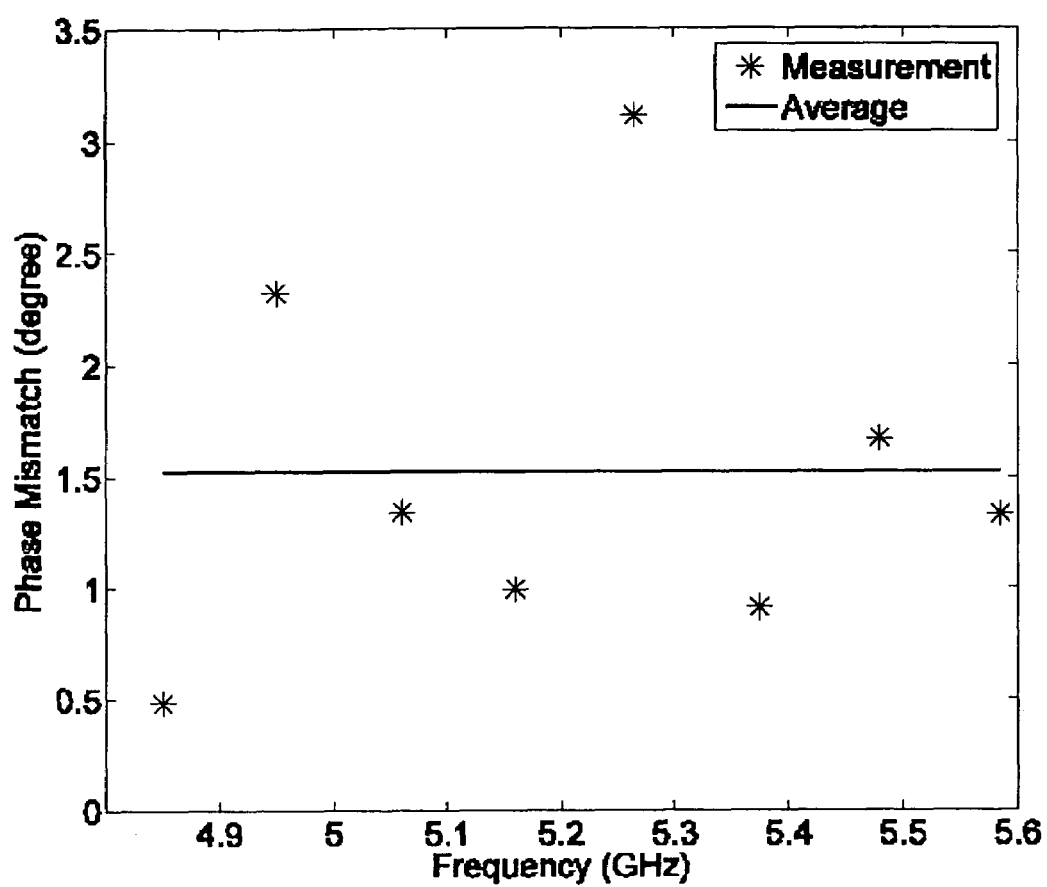
FIG. 21 is a plot of the quadrature phase mismatch measured in the middle of the tuning range.

In order the verify the phase accuracy of the prototype ILFD, phase difference is measured when $ILFD_1$ and $ILFD_2$ are tuned to the same free-running frequency, and the ILFD degenerates to the normal quadrature case. FIG. 21 shows that the average phase deviation from quadrature is about 1.5° degree across the locking range.

Figure 22:
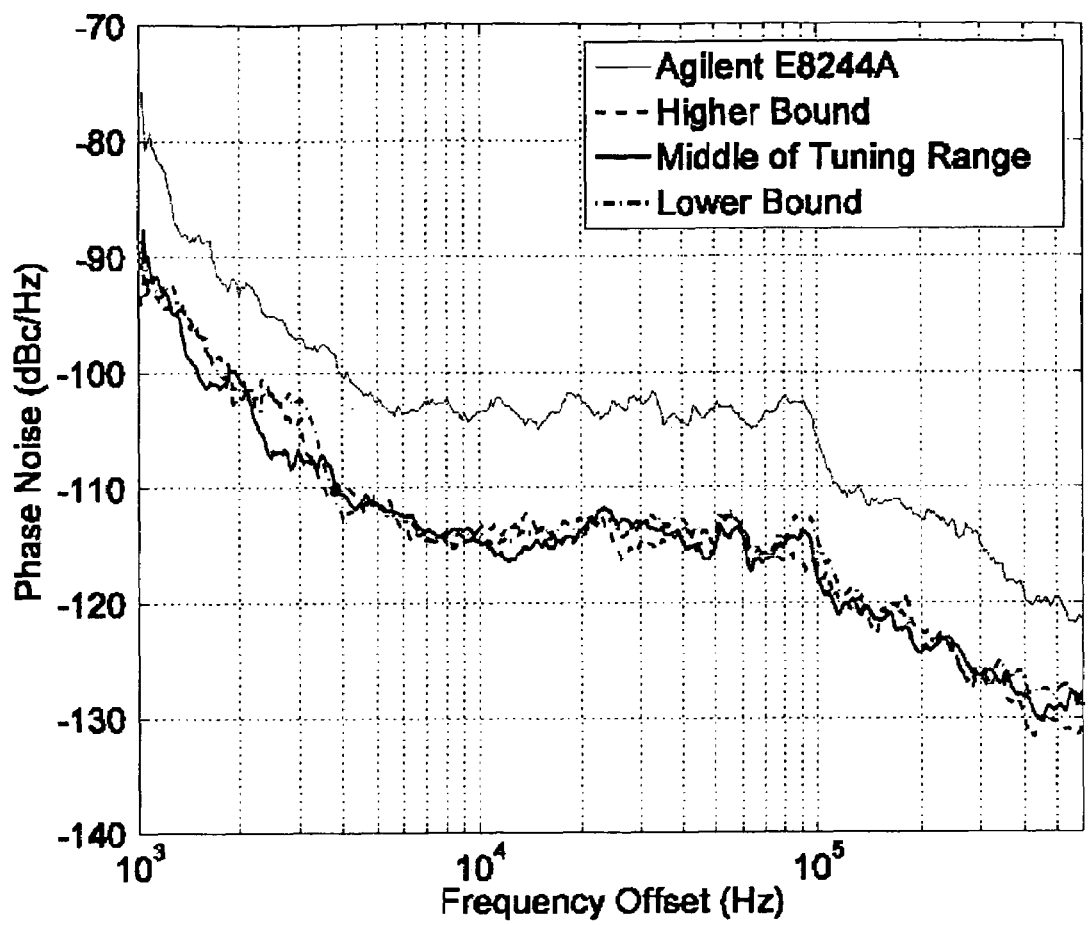
FIG. 22 is a plot of the phase noise within the locking range.

The phase noise across the locking range is also measured, together with that of the input signal, as shown in FIG. 22. The phase noise of the output is about 10 to 11 dB lower than that of the 21 GHz input. The phase noise suppression is quite close to the theoretical value of 12 dB for divide-by-4 operation.

A new double-balanced injection-locked frequency divider for dual-phase signal generation is presented. The ILFD can generate 4.78 GHz to 5.95 GHz dual-phase signals with phase difference tunable by 100°. It does not introduce any noticeable phase noise degradation. It is expected that this technique can be used to generate multi-phase signals with good phase accuracy and tunability.

While two preferred embodiments and variations thereof have been set forth above, those skilled in the art who have reviewed the present disclosure will readily appreciate that other embodiments can be realized within the scope of the invention. Some possible variations have been noted above. Moreover, numerical values are illustrative rather than limiting, as are fabrication techniques. Furthermore, ILFDs like those of the first preferred embodiment can be incorporated into the second preferred embodiment. Therefore, the present invention should be construed as limited only by the appended claims.

What is claimed is:

1. An injection-locked frequency divider for dividing a frequency of an input signal by an odd number, the injection-locked frequency divider comprising:
   an input for receiving the input signal;
   a first pair of transistors for receiving the input signal and for converting the input signal into differential currents;
   an inductor connected between the first pair of transistors;
   a second pair of transistors for receiving the differential currents and for mixing the differential currents to produce output signals; and
   an LC resonator connected to the second pair of transistors;
   wherein the first pair of transistors have even-order nonlinearities such that the frequency of the input signal is divided by the odd number in the output signals.

2. The injection-locked frequency divider of claim 1, wherein the odd number is 3.

3. The injection-locked frequency divider of claim 1, wherein the resonator comprises an LC tank.

4. The injection-locked frequency divider of claim 1, wherein the inductor provides a short-circuit path at a fundamental frequency of the injection-locked frequency divider.

5. The injection-locked frequency divider of claim 1, wherein the input applies the input signal to gates of the first pair of transistors.

6. The injection-locked frequency divider of claim 5, wherein the input comprises a balun, the balun comprising a first coil and a second coil, the second coil being connected between the gates of the first pair of transistors.

7. The injection-locked frequency divider of claim 6, wherein the first coil of the balun is connected between the input signal and ground.

8. The injection-locked frequency divider of claim 1, wherein the first and second pairs of transistors form a cascade topology.

* * * * *